(12) United States Patent
Gao

(10) Patent No.: US 12,057,877 B2
(45) Date of Patent: Aug. 6, 2024

(54) TRANSMITTER, TRANSCEIVER AND SIGNAL TRANSMISSION METHOD THEREFOR

(71) Applicants: Beijing ESWIN Computing Technology Co., Ltd., Beijing (CN); Nanjing ESWIN Computing Technology Co., Ltd., Nanjing (CN)

(72) Inventor: Yuan Gao, Beijing (CN)

(*) Notice: Subject to any disclaimer, the term of this patent is extended or adjusted under 35 U.S.C. 154(b) by 41 days.

(21) Appl. No.: 18/147,833

(22) Filed: Dec. 29, 2022

(65) Prior Publication Data

US 2023/0261689 A1 Aug. 17, 2023

(30) Foreign Application Priority Data

Jan. 26, 2022 (CN) .......................... 202210095813.8

(51) Int. Cl.
  *H04B 1/44* (2006.01)
  *H03H 7/42* (2006.01)
  *H04B 1/50* (2006.01)

(52) U.S. Cl.
  CPC .................. *H04B 1/44* (2013.01); *H03H 7/42* (2013.01); *H04B 1/50* (2013.01)

(58) Field of Classification Search
  CPC .......... H04B 1/44; H04B 1/12; H04B 1/1027; H04B 1/109; H04B 1/16; H04B 17/21;
  (Continued)

(56) References Cited

U.S. PATENT DOCUMENTS 9,543,995 B1 1/2017 Fabiano et al.
2011/0084864 A1* 4/2011 Balachandran ...... H03D 7/1458
  341/144
(Continued)

FOREIGN PATENT DOCUMENTS

CN 102439847 A 5/2012
CN 104205628 A 12/2014
(Continued)

OTHER PUBLICATIONS

Search Report dated Oct. 11, 2022 from Office Action for Chinese Application No. 202210095813 issued Nov. 3, 2022. 3 pgs.

*Primary Examiner* — Khanh C Tran
(74) *Attorney, Agent, or Firm* — Lerner David LLP

(57) ABSTRACT

The present disclosure provides a transmitter, a transceiver and a signal transmission method thereof. The transmitter comprises a signal amplification module, a balun and a feedback current generation module; the signal amplification module is configured to receive an input signal, amplify the input signal and output a differential signal to the balun; the balun is configured to receive the differential signal and convert the differential signal into a single-ended signal; and the feedback current generation module is configured to form electromagnetic coupling with the balun to generate a feedback current signal, wherein the feedback current signal is used as an input signal to a receiver. The transceiver and the signal transmission method provided by the present disclosure generate a feedback current signal according to the differential signal output by the signal amplification module, and input the feedback current signal instead of the traditional differential voltage signal to the receiver, thereby improving the signal noise ratio of the system.

20 Claims, 2 Drawing Sheets

(58) Field of Classification Search
CPC .......... H04B 17/318; H04B 1/50; H04B 1/48; H04B 2001/485; H03H 7/42
See application file for complete search history.

(56) References Cited

U.S. PATENT DOCUMENTS

| | | |
|---|---|---|
| 2011/0110463 A1 | 5/2011 | Chang et al. |
| 2013/0258911 A1 | 10/2013 | Choksi |
| 2021/0409065 A1 | 12/2021 | Gruber et al. |
| 2022/0286158 A1* | 9/2022 | Gangavaram ...... H04B 17/0085 |
| 2022/0399864 A1* | 12/2022 | Elsayed .................. H03F 3/211 |

FOREIGN PATENT DOCUMENTS

| | | |
|---|---|---|
| CN | 104283574 A | 1/2015 |
| CN | 107645300 A | 1/2018 |
| CN | 109428610 A | 3/2019 |
| CN | 112787675 A | 5/2021 |
| CN | 113851306 A | 12/2021 |

\* cited by examiner

TRANSMITTER, TRANSCEIVER AND SIGNAL TRANSMISSION METHOD THEREFOR

CROSS-REFERENCE TO RELATED APPLICATIONS

This application is based on and claims priority to China Patent Application No. 202210095813.8, filed on Jan. 26, 2022, in the China National Intellectual Property Administration, the disclosures of which are incorporated by reference herein in their entirety.

TECHNICAL FIELD

The present disclosure relates to the technical field of integrated circuits and in particular to a transmitter, a transceiver and a signal transmission method thereof.

BACKGROUND

In order to achieve higher transmission efficiency, higher-order modulation modes have been developed for existing communication systems. Meanwhile, with the application of wider bandwidths, communication module transceivers face more challenges. To deal with various challenges, various calibration algorithms and circuits are applied to the transceivers, especially IQ calibration and Digital Pre-Distortion (DPD) algorithms which determine the RF performance and ultimate QoS of the entire transceiver.

In order to realize IQ calibration and DPD algorithms, feedback receivers (ORXs) are required to receive signals emitted by transmitters (TXs), so as to detect the quality of the signals emitted by the TXs. The existing chips are all systems on chips (SOCs). As the process becomes more and more advanced, and the chip area is getting smaller and smaller, it is difficult to guarantee the isolation between modules. The high-frequency signals emitted by the TXs are transmitted to the ORXs through long wirings, which may interfere with the normal operation of other modules, resulting in the loss of SNR of the system.

SUMMARY

In view of the shortcomings of the existing methods, the present disclosure proposes a transmitter, a transceiver and a signal transmission method thereof, so as to solve the technical problem that the feedback loop of the existing transceivers may cause the loss of the SNR of the system.

In a first aspect, an embodiment of the present disclosure provides a transmitter, including: a signal amplification module, a balun, and a feedback current generation module;
the signal amplification module is configured to receive a signal from an emission source, amplify the input signal and output a differential signal to the balun;
the balun is configured to receive the differential signal and convert the differential signal into a single-ended signal; and
the feedback current generation module is configured to form electromagnetic coupling with the balun to generate a feedback current signal, wherein the feedback current signal is used as an input signal to a receiver.

Optionally, the feedback current generation module includes an induction coil, and the balun includes comprises a primary coil electrically connected to the signal amplification module and a secondary coil connected to an antenna; and
the induction coil forms electromagnetic coupling with the primary coil and the secondary coil to induce the feedback current signal.

Optionally, the primary coil and the secondary coil are disposed in the same layer; and
the induction coil and the primary coil are disposed in the same layer; or, the induction coil and the primary coil are disposed in different layers.

Optionally, when the induction coil and the primary coil are disposed in the same layer:
the induction coil is positioned at the outer ring of a coil formed by the primary coil and the secondary coil; or
the induction coil is positioned at the inner ring of a coil formed by the primary coil and the secondary coil.

Optionally, when the induction coil and the primary coil are disposed in different layers:
in a plane of the layer where the primary coil is disposed, the orthographic projection of the induction coil in the plane at least partially overlaps with that of the primary coil;
and/or the orthographic projection of the induction coil in the plane at least partially overlaps with that of the secondary coil.

Optionally, when the induction coil and the primary coil are disposed in different layers: the orthographic projection of the induction coil in the plane does not overlap with those of the primary coil and the secondary coil;
the orthographic projection of the induction coil in the plane is positioned at an outer ring of a coil formed by the primary coil and the secondary coil; or
the orthographic projection of the induction coil in the plane is positioned at an inner ring of a coil formed by the primary coil and the secondary coil.

In a second aspect, an embodiment of the present disclosure provides a transceiver, including a transmitter, a feedback path and a receiver;
wherein the transmitter includes a signal amplification module, a balun and a feedback current generation module; and
the signal amplification module is configured to receive a signal from an emission source, amplify the input signal and output a differential signal to the balun;
the balun is configured to receive the differential signal and convert the differential signal into a single-ended signal; and
the feedback current generation module is configured to form electromagnetic coupling with the balun to generate a feedback current signal, wherein the feedback current signal is used as an input signal to a receiver; and Optionally, the feedback current generation module includes an induction coil, and the balun includes comprises a primary coil electrically connected to the signal amplification module and a secondary coil connected to an antenna; and
the induction coil forms electromagnetic coupling with the primary coil and the secondary coil to induce the feedback current signal.

Optionally, the primary coil and the secondary coil are disposed in the same layer; and
the induction coil and the primary coil are disposed in the same layer; or, the induction coil and the primary coil are disposed in different layers.

Optionally, when the induction coil and the primary coil are disposed in the same layer:
the induction coil is positioned at an outer ring of a coil formed by the primary coil and the secondary coil; or the induction coil is positioned at the inner ring of a coil formed by the primary coil and the secondary coil.

Optionally, when the induction coil and the primary coil are disposed in different layers:

in a plane of the layer where the primary coil is disposed, the orthographic projection of the induction coil in the plane at least partially overlaps with that of the primary coil;

and/or the orthographic projection of the induction coil in the plane at least partially overlaps with that of the secondary coil.

Optionally, when the induction coil and the primary coil are disposed in different layers: the orthographic projection of the induction coil in the plane does not overlap with those of the primary coil and the secondary coil;

the orthographic projection of the induction coil in the plane is positioned at an outer ring of a coil formed by the primary coil and the secondary coil; or the orthographic projection of the induction coil in the plane is positioned at an inner ring of a coil formed by the primary coil and the secondary coil.

the feedback current generation module is connected to the receiver through the feedback path, so that the feedback current signal is transmitted to the receiver through the feedback path.

Optionally, the feedback path includes a switch module and the switch module is configured to control the transmission or cut-off of the feedback current signal.

Optionally, the receiver includes: a current-type attenuator, a receiver balun, a mixer, a transimpedance amplifier, and an analog-to-digital converter;

the current-type attenuator is configured to receive the feedback current signal and perform power attenuation on the feedback current signal;

the receiver balun is configured to perform impedance matching on the receiver;

the mixer is configured to perform frequency transform on the feedback current signal balanced by the balun;

the transimpedance amplifier is configured to convert the frequency-transformed feedback current signal into a voltage signal; and the analog-to-digital converter is configured to generate a digital signal according to the voltage signal.

In a third aspect, an embodiment of the present disclosure provides a signal transmission method based on a transceiver.

the transceiver includes a transmitter, a feedback path and a receiver; and the transmitter includes a signal amplification module a balun and a feedback current generation module; and the signal amplification module is configured to receive a signal from an emission source, amplify the input signal and output a differential signal to the balun;

the balun is configured to receive the differential signal and convert the differential signal into a single-ended signal; and the feedback current generation module is configured to form electromagnetic coupling with the balun to generate a feedback current signal, wherein the feedback current signal is used as an input signal to a receiver; and the feedback current generation module is connected to the receiver through the feedback path, so that the feedback current signal is transmitted to the receiver through the feedback path.

the method further includes:

receiving an input signal, amplifying the input signal and outputting a differential signal to the balun by the signal amplification module;

forming, by the feedback current generation module, electromagnetic coupling with the balun to generate a feedback current signal; and receiving the feedback current signal and transmitting the feedback current signal to the receiver by the feedback path.

the feedback current generation module comprises an induction coil, and the balun comprises a primary coil electrically connected to the signal amplification module and a secondary coil connected to an antenna; and the induction coil forms electromagnetic coupling with the primary coil and the secondary coil to induce the feedback current signal.

Optionally, the primary coil and the secondary coil are disposed in the same layer; and the induction coil and the primary coil are disposed in the same layer; or, the induction coil and the primary coil are disposed in different layers.

Optionally, when the induction coil and the primary coil are disposed in the same layer:

the induction coil is positioned at an outer ring of a coil formed by the primary coil and the secondary coil; or the induction coil is positioned at an inner ring of a coil formed by the primary coil and the secondary coil.

Optionally, when the induction coil and the primary coil are disposed in different layers:

in a plane of the layer where the primary coil is disposed, the orthographic projection of the induction coil in the plane at least partially overlaps with that of the primary coil;

and/or the orthographic projection of the induction coil in the plane at least partially overlaps with that of the secondary coil.

Optionally, when the induction coil and the primary coil are disposed in different layers: the orthographic projection of the induction coil in the plane does not overlap with those of the primary coil and the secondary coil;

the orthographic projection of the induction coil in the plane is positioned at an outer ring of a coil formed by the primary coil and the secondary coil; or the orthographic projection of the induction coil in the plane is positioned at an inner ring of a coil formed by the primary coil and the secondary coil.

The technical solutions in the embodiments of the present disclosure have the following beneficial effects.

The transmitter provided in the embodiments of the present disclosure includes a signal amplification module, a balun and a feedback current generation module; the signal amplification module is configured to receive an input signal, amplify the input signal and output a differential signal to the balun; the balun is configured to receive the differential signal and convert the differential signal into a single-ended signal; and the feedback current generation module is configured to form electromagnetic coupling with the balun to generate a feedback current signal, wherein the feedback current signal is used as an input signal to a receiver. In the embodiments of the present disclosure, the feedback current generation module 130 is provided to be capable of forming electromagnetic coupling with the balun 120 to generate a feedback current signal, and the feedback current signal is input to the receiver. That is, the signal emitted by the transmitter in the embodiments of the present disclosure is transmitted to the receiver in the current transmission mode. Compared with the voltage transmission mode, the current transmission mode will not result in large swing of the high-frequency signals, thereby effectively avoiding the interference to other modules when the high-frequency signals are input from the transmitter to the receiver and also improving the SNR of the system. In addition, since there will be no large voltage swing in the current transmission mode, the requirements on the reliability of advanced transistors are also reduced, which helps to increase the use time and lifetime of the chip.

The above description is only an overview of the technical solutions of the embodiments of the present disclosure. In order to understand the technical means of the embodiments of the present disclosure more clearly in order to implement them according to the contents of the description, and also to make those and other purposes, features and advantages more clear, the specific implementations of the embodiments of the present disclosure will be described below.

BRIEF DESCRIPTION OF THE DRAWINGS

The above and/or additional aspects and advantages of the present disclosure will become apparent and be readily understood from the following description of embodiments with reference to the accompanying drawings, in which.

REFERENCE NUMERALS

Figure 1:
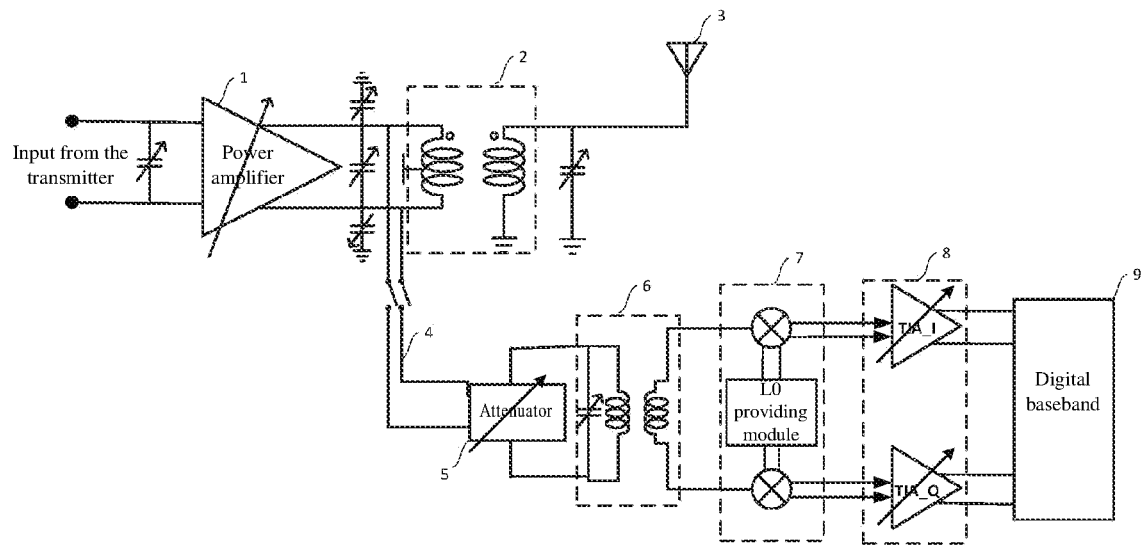
FIG. 1 is a schematic structure diagram of a transceiver of the related art.

100: transmitter; 110: signal amplification module; 120: balun; 130: current generation module; 200: feedback path; 210: switch module; 300: receiver; 310: current-type attenuator; 320: receiver balun; 330: mixer; 340: transimpedance amplifier; 350: analog-to-digital converter.

DETAILED DESCRIPTION

The present disclosure will be described in detail below. Examples of embodiments of the present disclosure will be illustrated below in the drawings throughout which same or similar reference numerals refer to same or similar elements or elements having same or similar functions. Also, detailed descriptions of known technologies will be omitted if they are not necessary for the illustrated features of the present disclosure. The embodiments described with reference to the drawings are illustrative, merely used for explaining the present disclosure and should not be regarded as any limitations thereto.

It may be understood by those skilled in the art that, unless otherwise defined, all terms (including technical and scientific terms) used herein have the same meaning as commonly understood by a person of ordinary skill in the art to which the present disclosure belongs. It should also be understood that terms, such as those defined in a general dictionary, should be understood to have meanings consistent with their meanings in the context of the prior art and, unless specifically defined as herein, should not be interpreted in idealistic or overly formal meaning.

It may be understood by those skilled in the art that singular forms "a", "an", "said", and "the" may be intended to include plural forms as well, unless otherwise stated. It should be further understood that the wording "include/including" used in this specification specifies the presence of the stated features, integers, steps, operations, elements and/or components, does not preclude the presence or addition of one or more other features, integers, steps, operations, elements, components, and/or combinations thereof. It should be understood that, when an element is referred to as being "connected to" another element, it may be directly connected to the other element or provided with intervening elements therebetween. Also, "connection" as used herein may include wireless connection. As used herein, the wording "and/or" includes all or any of one or more associated listed items or combinations thereof.

From the GSM (Global System for Mobile Communications) in the 2G stage to the WCDMA (Wideband Code Division Multiple Access) in the 3G stage, and then to the LTE-OFDMA (Orthogonal Frequency Division Multiplexing) in the 4G stage and now NR (New Radio) in the 5G stage, the modulation modes are improved for the communication system as much as possible within the limited spectrum resources for the purpose of the transmission of more information. Meanwhile, with the application of wider bandwidths, transceivers face more challenges. To deal with various challenges, various calibration algorithms and circuits are applied to the transceivers, especially IQ calibration and DPD algorithms which determine the RF performance and ultimate QoS of the entire transceiver.

In order to realize IQ calibration and DPD algorithms, ORXs are required to receive signals emitted by TXs, so as to detect the quality of the signals emitted by the TXs, and then digital basebands and algorithms are used to optimize the transmission signal source of the transmitter for the purpose of adapting the communication link of the transmitter so that the output transmitted signal can have the optimum SNR.

However, the traditional transceivers are all in voltage transmission mode, in which the voltage signals emitted by the transmitters are transmitted to the receivers through a long wiring channel, and the transmitted signals are detected through receiver links. The high-frequency voltage signals emitted by the transmitters are transmitted to the receivers through long wirings, which may interfere with the normal operation of other modules, resulting in the loss of SNR of the system.

Specifically, as shown in FIG. 1, the transceiver in the related art includes a receiver and a transmitter. The transmitter includes a driver amplifier or a power amplifier 1, and a transmitter-side balun 2 connected to the driver amplifier or power amplifier 1. The entire signal link is as follows: an input signal from a transmitter is amplified by the driver amplifier or power amplifier 1, then the amplified signal is converted from a differential signal to a single-ended signal by the balun 2, and the single-ended signal is fed to an antenna 3 and emitted by the antenna 3.

Still referring to FIG. 1, the receiver includes a voltage-type attenuator 5, a receiver-side balun 6, a double-balanced passive mixer 7, a transimpedance amplifier 8 and an analog-to-digital converter (not shown). The differential input terminals of the voltage-type attenuator 5 are connected to the differential output terminals of the driver amplifier or power amplifier 1 through a switch. After being amplified by the driver amplifier or power amplifier 1, the differential signal (voltage signal) is then attenuated by the voltage-type attenuator 5 in voltage magnitude and then passed to the receiver-side balun 6. The receiver-side balun 6 is configured to match the impedance of the differential output terminals of the driver amplifier or power amplifier 1 to that of the output terminals of the transimpedance amplifier 8 (the circuits of TIA-I and TIA-Q in the transimpedance amplifier 8 are the same, except that the signals received by the two have a phase difference of 90 degrees) to improve the signal transmission efficiency. Then, the frequency of the attenuated differential signal is converted, by the double-balanced passive mixer 7, into a frequency that can be processed by the digital baseband. Then, the differential signal is converted from current to voltage by the transimpedance amplifier 8, and then input to the analog-to-digital converter where the analog signal is converted into a digital signal. The converted digital signal is input to the digital baseband 9 for demodulation. The input signal from the transmitter is adjusted by DPD or IQ calibration.

Still referring to FIG. 1, the traditional feedback path 4 is connected to the differential input terminals of the voltage-type attenuator 5, through a switch, at the differential output terminals of the driver amplifier or power amplifier 1, and the differential signal is transmitted, as a feedback signal, from the transmitter to the receiver. In this process, the differential signal transmits a voltage signal, and due to the need for long-distance transmission through the antenna 3, the differential signal output by the driver amplifier or power amplifier 2 is a signal with high frequency and large voltage amplitude. In addition, for the commonly used Frequency Division Duplexing (FDD) system, the transmitter and the receiver operates at the same time, so there would be a problem of isolation. The farther the receiver and the transmitter are disposed, the better the isolation. However, if the distance between the transmitter and the receiver is relatively long, it is necessary for the feedback signal to pass through a long feedback path 4 so as to be transmitted from the transmitter to the receiver.

As the process becomes more and more advanced, and the chip area is getting smaller and smaller, it is difficult to guarantee the isolation between modules. Therefore, the feedback signal with high frequency and large voltage amplitude, output by the transmitter, is transmitted to the receiver via a long feedback path, which may produce great electromagnetic radiation and thus interfere with the normal operation of other modules, resulting in the loss of SNR of the system.

In addition, due to the long-distance transmission of the transmitter, with the use of high-frequency voltage signals in the transmission process of the prior art, there exist higher requirements on both interference and switch design. More challenges exist with increasingly advanced processes and smaller chip size.

In view of the above problems in the prior art, the present disclosure proposes a transmitter. By providing a feedback current generation module which generates a feedback current signal, the feedback current signal is used as the feedback signal instead of the traditional voltage signal and input to the receiver, thus solving the technical problem in the that the feedback loop of the transceivers may cause interference on other modules of the chip and result in the loss of SNR of the system.

The technical solutions of the present disclosure and how to solve the above technical problems by the technical solutions of the present disclosure will be described below by specific embodiments in detail.

Figure 2:
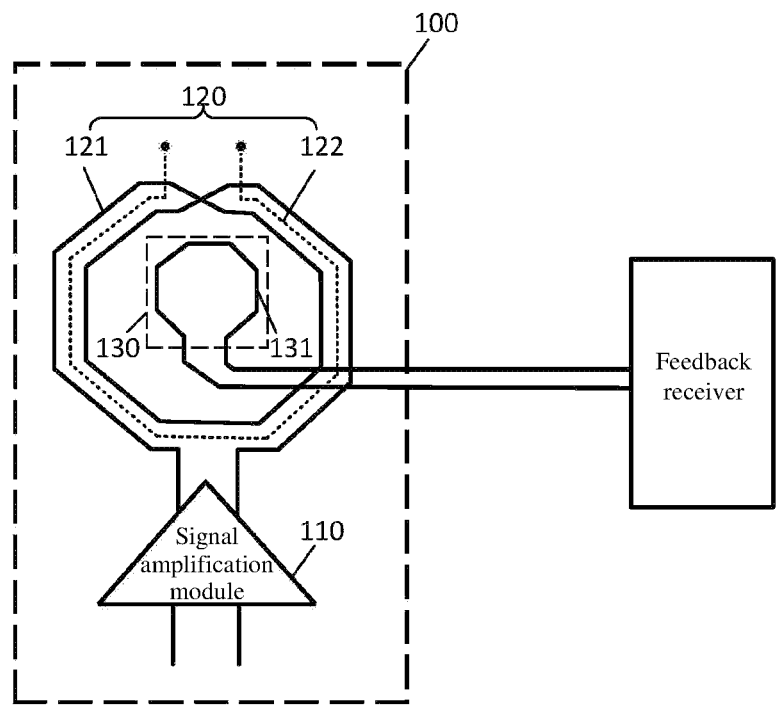
FIG. 2 is a schematic structure diagram of a transmitter according to an embodiment of the present disclosure.

As shown in FIG. 2, an embodiment of the present disclosure provides a transmitter 100, including a signal amplification module 110, a balun 120 and a feedback current generation module 130. The signal amplification module 110 is configured to receive a signal from an emission source, amplify the signal and output a differential signal to the balun 120. Specifically, the signal amplification module 110 may be provided as a power amplifier or a driver amplifier. The balun 120 is configured to receive the differential signal and convert the differential signal into a single-ended signal. The feedback current generation module 130 is configured to form electromagnetic coupling with the balun 120 to generate a feedback current signal, wherein the feedback current signal is used as an input signal to a receiver 200.

It should be noted that the signal amplification module 110, the balun 120 and the feedback current generation module 130 are named for easy understanding of the present disclosure, and these modules may also be referred to as other names, which will not be described in a limiting manner in the present disclosure.

In the embodiments of the present disclosure, the feedback current generation module 130 is provided to be capable of forming electromagnetic coupling with the balun 120 to generate a feedback current signal, and the feedback current signal is input to the receiver. That is, the signal emitted by the transmitter in the embodiments of the present disclosure is transmitted to the receiver in the current transmission mode. Compared with the voltage transmission mode, the current transmission mode will not result in large swing of the high-frequency signals, thereby effectively avoiding the interference to other modules when the high-frequency signals are input from the transmitter to the receiver and also improving the SNR of the system. In addition, since there will be no large voltage swing in the current transmission mode, the requirements on the reliability of advanced transistors are also reduced, which helps to increase the use time and lifetime of the chip.

In a specific embodiment, still referring to FIG. 2, the feedback current generation module 130 includes an induction coil 131; the balun 120 includes a primary coil 121 electrically connected to the signal amplification module 110, and a secondary coil 122 connected to an antenna (not shown); the differential signal output by the signal amplification module 110 generates an induced magnetic field through the primary coil 121, and the secondary coil 122 generates induced current in the opposite direction in the induced magnetic field, which is output to the antenna; and the induction coil 131 forms electromagnetic coupling with the primary coil 121 and the secondary coil 122 to induce a feedback current signal.

Specifically, the primary coil 121 and the secondary coil 122 included in the balun 120 are disposed in the same layer; in the embodiment of the present disclosure, the induction coil 131 may be disposed in the same layer as the primary coil 121 and the secondary coil 122; the induction coil 131 may also be disposed in a different layer from the primary coil 121 and the secondary coil 122.

It should be noted that, the primary coil 121 and the secondary coil 122 being disposed in the same layer means that the primary coil 121 and the secondary coil 122 are formed by a same patterning process and the respective orthographic projections of the primary coil 121 and the secondary coil 122 do not overlap in the same plane; and, the induction coil 131 being disposed in the same layer as the primary coil 121 and the secondary coil 122 means that the induction coil 131, the primary coil 121 and the secondary coil 122 are formed by a same patterning process and the respective orthographic projections of the induction coil 131, the primary coil 121 and the secondary coil 122 do not overlap in a same plane.

In the specific implementation, the patterning process in the embodiment of the present disclosure includes photoresist coating, exposure, development, etching, and removal of some or all of the photoresist. In the specific manufacturing process, a metal layer may be firstly formed on a substrate prepared in advance, and then the induction coil 131, the primary coil 121 and the secondary coil 122 are simultaneously formed by performing one patterning process on the metal layer.

It should be noted that, the induction coil 131 being disposed in a different layer from the primary coil 121 and the secondary coil 122 means that the induction coil 131 is formed by a different patterning process from the primary coil 121 and the secondary coil 122, that is, the induction coil 131 is formed by a first patterning process while the primary coil 121 and the secondary coil 122 are formed by a second patterning process. With respect to the respective orthographic projections of the induction coil 131, the primary coil 121 and the secondary coil 122 in a same plane (for example, a plane parallel to the plane where the primary coil 121 and the secondary coil 122 are positioned), the orthographic projection of the induction coil 131 may overlap with the orthographic projection of the primary coil 121, the orthographic projection of the induction coil 131 may also overlap with the orthographic projection of the secondary coil 122, and the orthographic projection of the induction coil 131 may also overlap with both the orthographic projection of the primary coil 121 and the orthographic projection of the secondary coil 122.

In a specific embodiment, if the induction coil 131 is disposed in the same layer as the primary coil 121, the induction coil 131 is disposed at the outer ring of a coil formed by the primary coil 121 and the secondary coil 122, or the induction coil 131 is disposed at the inner ring of a coil formed by the primary coil 121 and the secondary coil 122. When the induction coil 131 is disposed in the same layer as the primary coil 121, the induction coil 131 may be formed by a same patterning process as the primary coil 121 and the secondary coil 122, which can reduce the production cost.

In another specific embodiment, if the induction coil 131 is disposed in a different layer from the primary coil 121, in the plane of the layer where the primary coil 121 is disposed, the orthographic projection of the induction coil 131 overlaps with that of the primary coil 121 in whole or in part in the plane, or the orthographic projection of the induction coil 131 overlaps with that of the secondary coil 122 in whole or in part in the plane, or the orthographic projection of the induction coil 131 in the plane overlaps with both the primary coil 121 and the secondary coil 122 in part; or, the orthographic projection of the induction coil 131 does not overlap with those of the primary coil 121 and the secondary coil 122 in the plane, "not overlap" means that the orthographic projection of the induction coil 131 has no overlapped part with those of the primary coil 121 and the secondary coil 122 in the plane. When the induction coil 131 is disposed in a different layer from the primary coil 121, the inner diameter and width of the induction coil 131 can be adjusted in a larger range. Thus, more magnitudes of inducted current can be obtained by combination, and the range of the magnitudes of the feedback current signal received by the receiver becomes larger.

Specifically, when the orthographic projection of the induction coil 131 does not overlap with those of the primary coil 121 and the secondary coil 122 in the plane of the layer where the primary coil 121 is disposed: the orthographic projection of the induction coil 131 in the plane is positioned at the outer ring of a coil formed by the primary coil 121 and the secondary coil 122; or the orthographic projection of the induction coil 131 in the plane is positioned at the inner ring of a coil formed by the primary coil 121 and the secondary coil 122.

In the specific implementation, if the induction coil 131 is disposed in a different layer from the primary coil 121, the material of the induction coil 131 may also be the same as those of the primary coil 121 and the secondary coil 122 to reduce the manufacturing cost.

Still referring to FIG. 2, the turn ratio of the primary coil 121 and the secondary coil 122 may be 2:1. The primary coil 121 is used as the load of the signal amplification module 110. The secondary coil 122 is connected to the terminal impedance. The high-frequency differential signal generates an induced magnetic field through the primary coil 121. The secondary coil 122 generates induced current in the opposite direction in the induced magnetic field and outputs it. The induction coil 131 is the induction coil of the feedback current generation module. The magnitude of the inducted current on the induction coil can be controlled by the mutual inductance coefficient K. By adjusting the inner diameter of the induction coil 131 and the width of the metal wires that make up the induction coil 131, K with different values can be obtained by combination. Therefore, different magnitudes of induced current can be obtained by combination, so that the magnitude of the feedback current signal transmitted from the transmitter 100 to the receiver can be controlled. The inner diameter of the induction coil 131 and the width of the metal wires that make up the induction coil 131 may be set according to actual conditions, which will not be limited in the embodiment of the present disclosure.

Figure 3:
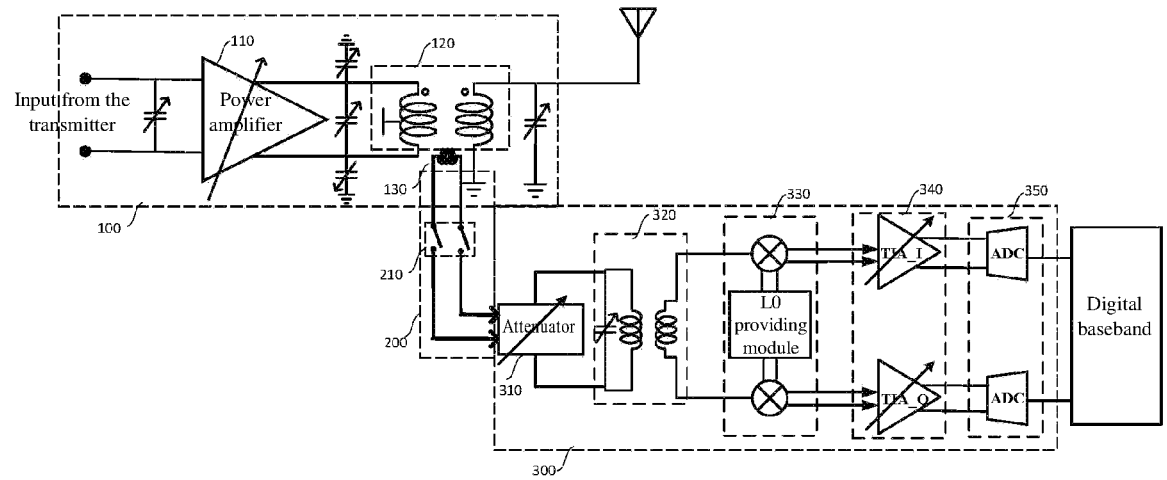
FIG. 3 is a schematic structure diagram of a transceiver according to an embodiment of the present disclosure.

Based on the same inventive concept, an embodiment of the present disclosure provides a transceiver. As shown in FIG. 3, the transceiver includes the transmitter 100 provided by the embodiment of the present disclosure, and further includes a feedback path 200 and a receiver 300. The output terminal of the feedback current generation module 130 is connected to the receiver 300 through the feedback path 200, so that the feedback current signal is transmitted to the receiver 300 through the feedback path 200.

It should be noted that the receiver in the embodiment of the present disclosure may be in a feedback mode of the receiver, or may be a feedback receiver.

With the transceiver provided by the embodiment of the present disclosure, since the output terminal of the feedback current generation module is connected to the receiver through the feedback path so that the feedback current signal is transmitted to the receiver through the feedback path. That is, in the embodiment of the present disclosure, instead of the traditional voltage signal, the feedback current signal is input to the receiver 300, the differential signal with a large voltage amplitude is prevented from interfering with other modules when being input from the transmitter 100 to the receiver 300, and thus the SNR of the system is improved.

Specifically, still referring to FIG. 3, the feedback path 200 includes a switch module 210, and the switch module 210 is configured to control the transmission or cut-off of the feedback current signal. In the specific implementation, the switch module 210 may be provided as a transistor. The transmission of the feedback current signal is controlled by controlling the transistor to turn on by a control signal, or the cut-off of the feedback current signal is controlled by controlling the transistor to turn off by a control signal. Since the feedback signal transmitted in the embodiment of the present disclosure is a current signal without large voltage swing, the requirements on the reliability of the switch module 210 are also reduced, which helps to increase the use time and lifetime of the chip.

In a specific embodiment, still referring to FIG. 3, the receiver 300 includes: a current-type attenuator 310, a receiver balun 320, a mixer 330, a transimpedance amplifier 340 and an analog-to-digital converter 350.

The current-type attenuator 310 is configured to receive a feedback current signal and perform power attenuation on the feedback current signal. It should be noted that, because the feedback current signal is used for feedback in the embodiment of the present disclosure, instead of the traditional high-impedance voltage-type attenuator, a low-impedance current-type attenuator is used in the embodiment of the present disclosure. Because the overall input impedance of the receiver is low-impedance, the equivalent impedance is the impedance of the switch of the mixer 330 and the input impedance of the transimpedance amplifier 340. In the specific implementation, the equivalent impedance is not more than 10 ohms in total. Thus, the feedback current signal can be transmitted from the induction coil 131 of the feedback current generation module 130 to the receiver 300.

The receiver balun 320 is configured to perform impedance matching on the receiver 300. Because the impedance at the output terminal of the transmitter 100 is relatively high and the impedance at the output terminal of the transimpedance amplifier 340 is relatively low, the receiver balun 320 is required to solve the problem of impedance mismatch during feedback signal transmission. The receiver balun 320 is configured to convert the impedance at the input terminal of the receiver 300 to the impedance of the output terminal of the receiver 300 (that is, configured to convert high impedance to low impedance). Thus, better signal transmission performance is obtained, and the sensitivity of the receiver 300 is improved.

The mixer 330 is configured to perform frequency transform on the feedback current signal output by the receiver balun 320. Because the single-ended signal output by the receiver 100 needs to be emitted through the antenna ultimately, the differential output of the signal amplification module 110 is a high-frequency signal, and the feedback current signal generated by electromagnetic induction is also a high-frequency signal. However, the high-frequency signal cannot be processed by the digital baseband. Therefore, the mixer 300 is required to perform frequency transform to convert the high-frequency feedback current signal to a lower-frequency current signal that can be processed by the digital baseband.

Specifically, as shown in FIG. 3, the mixer 330 is a double-balanced passive mixer. The local oscillation frequency LO is provided by a local oscillation frequency providing module with a duty cycle of 25%. The high-frequency feedback current signal output by the receiver balun 320 is converted into a low-frequency current signal that can be processed by the digital baseband.

The transimpedance amplifier 340 is configured to convert the frequency-transformed feedback current signal into a voltage signal, and transmit the voltage signal to the analog-to-digital converter 350. The analog-to-digital converter 350 is configured to generate a digital signal according to the voltage signal, and transmit the digital signal to the digital baseband for demodulation. The input signal from the transmitter 100 is optimized according to the IQ algorithm or the DPD algorithm for the purpose of adaption to the communication link of the transmitter 100, so that the transmitted signal output by the transmitter 100 can have the optimum SNR.

Further, for those skilled in the art, analog filtering can be performed according to actual needs before the voltage signal is input to the analog-to-digital converter 350, and digital filtering can also be performed on the digital signal generated by the analog-to-digital converter 350. The specific methods of analog filtering and digital filtering and the adopted filter circuit are similar to those in the prior art, and will not be repeated here.

Figure 4:
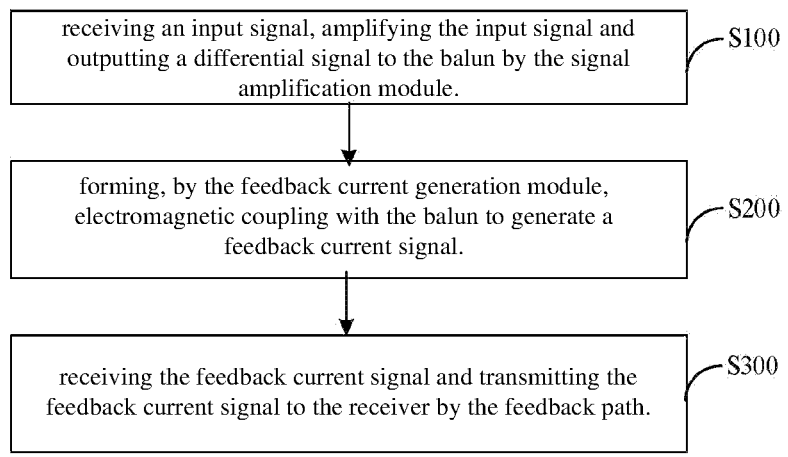
FIG. 4 is a flowchart of a signal transmission method according to an embodiment of the present disclosure.

Based on the same inventive concept, an embodiment of the present disclosure provides a signal transmission method based on the transceiver, as shown in FIG. 4, including:

S100: receiving an input signal, amplifying the input signal and outputting a differential signal to the balun by the signal amplification module;

S200: forming, by the feedback current generation module, electromagnetic coupling with the balun to generate a feedback current signal; and S300: receiving the feedback current signal and transmitting the feedback current signal to the receiver by the feedback path.

The various illustrations of specific signal transmission method in the embodiment of the present disclosure has been presented above, and will not be repeated here. In embodiments of the present disclosure, since the current transmission mode is adopted when the signal feedback is performed, there exists no large swing for the high-frequency signal, which effectively avoids the interference to other modules when the high-frequency signals are input from the transmitter to the receiver and also improves the SNR of the system.

The technical solutions in the embodiments of the present disclosure have the following beneficial effects.

Firstly, the transmitter in the embodiment of the present disclosure includes a signal amplification module, a balun and a feedback current generation module; in the embodiment of the present disclosure, the feedback current generation module 130 is provided to be capable of forming electromagnetic coupling with the balun 120 to generate a feedback current signal, and the feedback current signal is input to the receiver. That is, the signal emitted by the transmitter in the embodiments of the present disclosure is transmitted to the receiver in the current transmission mode. Compared with the voltage transmission mode, the current transmission mode will not result in large swing of the high-frequency signals, thereby effectively avoiding the interference to other modules when the high-frequency signals are input from the transmitter to the receiver and also improving the SNR of the system. In addition, since there will be no large voltage swing in the current transmission mode, the requirements on the reliability of advanced transistors are also reduced, which helps to increase the use time and lifetime of the chip.

Secondly, the feedback current generation module in the embodiment of the present disclosure includes an induction coil. When the induction coil 131 is disposed in the same layer as the primary coil 121 and the secondary coil 122, the induction coil 131 may be formed by a same patterning process as the primary coil 121 and the secondary coil 122, which can reduce the production cost.

Thirdly, the feedback current generation module in the embodiment of the present disclosure includes an induction coil. When the induction coil 131 is disposed in a different layer from the primary coil 121 and the secondary coil 122, the adjustable range of the inner diameter and width of the induction coil 131 is larger. Thus, more magnitudes of induced current can be obtained by combination, and the range of the magnitudes of the feedback current signal received by the receiver becomes larger.

Fourthly, the feedback path 200 in the embodiment of the present disclosure includes a switch module 210. The switch module 210 may be provided as a transistor. Since the feedback signal transmitted in the embodiment of the present disclosure is a current signal without large voltage swing, the requirements on the reliability of the switch module 210 (transistor) are also reduced, which helps to increase the use time and lifetime of the chip.

It may be understood by a person of ordinary skill in the art that the operations, methods, steps in the flows, measures and solutions already discussed in the present disclosure may be alternated, changed, combined or deleted. Further, the operations, methods, other steps in the flows, measures and solutions already discussed in the present disclosure may also be alternated, changed, rearranged, decomposed, combined or deleted. Further, prior arts having the operations, methods, the steps in the flows, measures and solutions already discussed in the present disclosure may also be alternated, changed, rearranged, decomposed, combined or deleted.

In the description of the present disclosure, it should be understood that orientations or location relationships indicated by terms such as "center", "up", "down", "front", "behind", "left", "right", "vertical", "horizontal", "top", "bottom", "inside" and "outside" are orientations and location relationships illustrated in the accompanying drawings, merely for ease of describing the present disclosure and simplifying the description, rather than to indicate or imply that the stated devices or elements must have a specific orientation and be constructed and operated in a specific orientation, and shall not be regarded as any limitation to the present disclosure.

The terms "first" and "second" are simply used for the purpose of description, and should not be regarded as indicating or implying relative importance or implicitly indicating the number of indicated technical features. Therefore, the features defined as "first" and "second" may explicitly or implicitly include one or more of the features. In the description of the present invention, unless specifically stated otherwise, "a plurality of" means "two" or "more than two".

In the description, the specific features, structures, materials, or characteristics may be combined in a proper manner in any one or more embodiments or examples.

It should be understood that although the steps in the flowchart shown in the drawings are sequentially displayed by following the arrows, these steps are not necessarily performed in the order indicated by the arrows. Unless explicitly stated herein, the execution order of these steps is not strictly limited, and they can be performed in other orders. Moreover, at least some of the steps in the flowcharts shown in the drawings may include multiple sub-steps or multiple stages. These sub-steps or stages are not necessarily performed at the same moment of time, and instead, may be performed at different moments of time. The sub-steps or stages are not necessarily performed sequentially, and instead, may be performed in turn or alternately with other steps or at least some of the sub-steps or stages of other steps.

The foregoing descriptions are merely some implementations of the present disclosure. It should be noted that, to a person of ordinary skill in the art, various improvements and modifications may be made without departing from the principle of the present disclosure, and these improvements and modifications shall be deemed as falling into the protection scope of the present disclosure.

What is claimed is:

1. A transmitter, comprising: a signal amplification module, a balun and a feedback current generation module;
    the signal amplification module is configured to receive a signal from an emission source, amplify the input signal and output a differential signal to the balun;
    the balun is configured to receive the differential signal and convert the differential signal into a single-ended signal; and
    the feedback current generation module is configured to form electromagnetic coupling with the balun to generate a feedback current signal, wherein the feedback current signal is used as an input signal to a receiver.

2. The transmitter according to claim 1, wherein the feedback current generation module comprises an induction coil, and the balun comprises a primary coil electrically connected to the signal amplification module and a secondary coil connected to an antenna; and
    the induction coil forms electromagnetic coupling with the primary coil and the secondary coil to induce the feedback current signal.

3. The transmitter according to claim 2, wherein the primary coil and the secondary coil are disposed in the same layer; and
    the induction coil and the primary coil are disposed in the same layer; or, the induction coil and the primary coil are disposed in different layers.

4. The transmitter according to claim 3, wherein when the induction coil and the primary coil are disposed in the same layer:
    the induction coil is positioned at an outer ring of a coil formed by the primary coil and the secondary coil; or
    the induction coil is positioned at an inner ring of a coil formed by the primary coil and the secondary coil.

5. The transmitter according to claim 3, wherein when the induction coil and the primary coil are disposed in different layers:
    in a plane of the layer where the primary coil is disposed, the orthographic projection of the induction coil in the plane at least partially overlaps with that of the primary coil; and/or the orthographic projection of the induction coil in the plane at least partially overlaps with that of the secondary coil.

6. The transmitter according to claim 3, wherein when the induction coil and the primary coil are disposed in different layers: the orthographic projection of the induction coil in the plane does not overlap with those of the primary coil and the secondary coil;
    the orthographic projection of the induction coil in the plane is positioned at an outer ring of a coil formed by the primary coil and the secondary coil; or
    the orthographic projection of the induction coil in the plane is positioned at an inner ring of a coil formed by the primary coil and the secondary coil.

7. A transceiver, comprising a transmitter, a feedback path and a receiver,
    wherein the transmitter comprises a signal amplification module, a balun and a feedback current generation module; and
    the signal amplification module is configured to receive a signal from an emission source, amplify the input signal and output a differential signal to the balun;
    the balun is configured to receive the differential signal and convert the differential signal into a single-ended signal; and the feedback current generation module is configured to form electromagnetic coupling with the balun to generate a feedback current signal, wherein the feedback current signal is used as an input signal to a receiver; and wherein the feedback current generation module is connected to the receiver through the feedback path, so that the feedback current signal is transmitted to the receiver through the feedback path.

8. The transceiver according to claim 7, wherein the feedback current generation module comprises an induction coil, and the balun comprises a primary coil electrically connected to the signal amplification module and a secondary coil connected to an antenna; and the induction coil forms electromagnetic coupling with the primary coil and the secondary coil to induce the feedback current signal.

9. The transceiver according to claim 8, wherein the primary coil and the secondary coil are disposed in the same layer; and the induction coil and the primary coil are disposed in the same layer; or, the induction coil and the primary coil are disposed in different layers.

10. The transceiver according to claim 9, wherein when the induction coil and the primary coil are disposed in the same layer:

the induction coil is positioned at an outer ring of a coil formed by the primary coil and the secondary coil; or the induction coil is positioned at an inner ring of a coil formed by the primary coil and the secondary coil.

11. The transceiver according to claim 9, wherein when the induction coil and the primary coil are disposed in different layers:

in a plane of the layer where the primary coil is disposed, the orthographic projection of the induction coil in the plane at least partially overlaps with that of the primary coil; and/or the orthographic projection of the induction coil in the plane at least partially overlaps with that of the secondary coil.

12. The transceiver according to claim 9, wherein when the induction coil and the primary coil are disposed in different layers: the orthographic projection of the induction coil in the plane does not overlap with those of the primary coil and the secondary coil;

the orthographic projection of the induction coil in the plane is positioned at an outer ring of a coil formed by the primary coil and the secondary coil; or the orthographic projection of the induction coil in the plane is positioned at an inner ring of a coil formed by the primary coil and the secondary coil.

13. The transceiver according to claim 7, wherein the feedback path comprises a switch module and the switch module is configured to control the transmission or cut-off of the feedback current signal.

14. The transceiver according to claim 7, wherein the receiver comprises: a current-type attenuator, a receiver balun, a mixer, a transimpedance amplifier, and an analog-to-digital converter;

the current-type attenuator is configured to receive the feedback current signal and perform power attenuation on the feedback current signal;

the receiver balun is configured to perform impedance matching on the receiver;

the mixer is configured to perform frequency transform on the feedback current signal balanced by the balun;

the transimpedance amplifier is configured to convert the frequency-transformed feedback current signal into a voltage signal; and the analog-to-digital converter is configured to generate a digital signal according to the voltage signal.

15. A signal transmission method based on a transceiver, wherein the transceiver comprises a transmitter, a feedback path and a receiver; and wherein the transmitter comprises a signal amplification module, a balun and a feedback current generation module; and the signal amplification module is configured to receive a signal from an emission source, amplify the input signal and output a differential signal to the balun;

the balun is configured to receive the differential signal and convert the differential signal into a single-ended signal; and the feedback current generation module is configured to form electromagnetic coupling with the balun to generate a feedback current signal, wherein the feedback current signal is used as an input signal to a receiver; and wherein the feedback current generation module is connected to the receiver through the feedback path, so that the feedback current signal is transmitted to the receiver through the feedback path;

wherein the method comprising:

receiving an input signal, amplifying the input signal and outputting a differential signal to the balun by the signal amplification module;

forming, by the feedback current generation module, electromagnetic coupling with the balun to generate a feedback current signal; and receiving the feedback current signal and transmitting the feedback current signal to the receiver by the feedback path.

16. The method according to claim 15, wherein the feedback current generation module comprises an induction coil, and the balun comprises a primary coil electrically connected to the signal amplification module and a secondary coil connected to an antenna; and the induction coil forms electromagnetic coupling with the primary coil and the secondary coil to induce the feedback current signal.

17. The method according to claim 16, wherein the primary coil and the secondary coil are disposed in the same layer; and the induction coil and the primary coil are disposed in the same layer; or, the induction coil and the primary coil are disposed in different layers.

18. The method according to claim 17, wherein when the induction coil and the primary coil are disposed in the same layer:

the induction coil is positioned at an outer ring of a coil formed by the primary coil and the secondary coil; or the induction coil is positioned at an inner ring of a coil formed by the primary coil and the secondary coil.

19. The method according to claim 17, wherein when the induction coil and the primary coil are disposed in different layers:

in a plane of the layer where the primary coil is disposed, the orthographic projection of the induction coil in the plane at least partially overlaps with that of the primary coil; and/or the orthographic projection of the induction coil in the plane at least partially overlaps with that of the secondary coil.

20. The method according to claim 17, wherein when the induction coil and the primary coil are disposed in different layers: the orthographic projection of the induction coil in the plane does not overlap with those of the primary coil and the secondary coil;

the orthographic projection of the induction coil in the plane is positioned at an outer ring of a coil formed by the primary coil and the secondary coil; or the orthographic projection of the induction coil in the plane is positioned at an inner ring of a coil formed by the primary coil and the secondary coil.

* * * * *